Aug. 4, 1964 J. J. GAVERN ETAL 3,143,669

HIGH FREQUENCY TRANSISTOR BISTABLE MULTIVIBRATOR

Filed Sept. 14, 1962

INVENTORS
FRANK H. HEISSENBUTTEL, 3d
JOSEPH J. GAVERN
BY
H. H. Locke
ATT'YS.

United States Patent Office 3,143,669

Patented Aug. 4, 1964

3,143,669
HIGH FREQUENCY TRANSISTOR BISTABLE MULTIVIBRATOR

Joseph J. Gavern, Odenton, and Frank H. Heissenbuttel III, Baltimore, Md., assignors, by mesne assignments, to the United States of America as represented by the Secretary of the Navy

Filed Sept. 14, 1962, Ser. No. 223,856
2 Claims. (Cl. 307—88.5)

This invention relates to multivibrator circuitry and more particularly to a relatively high frequency transistor multivibrator device having wide application in areas such as switching and digital logic circuitry.

As the demand increases for faster and faster digital computation equipment, an ever-present need exists for component logic circuitry capable of reliable performance at these constantly increasing rates of operation. The present invention satisfies a portion of this need by providing a reliable high speed transistor multivibrator circuit having a frequency-of-operation capability in the tens of megacycles region.

An object of the present invention is the provision of a fast acting, bistable transistor multivibrator.

Another object is to provide a transistor logic circuit capable of operation in the tens of megacycles region.

A further object of the invention is to provide a reliable, high speed, bistable transistor multivibrator circuit utilizing emitter follower action to reduce the time constant of the input circuit thereof to a small fraction of its usual value in circuitry of the prior art, to enable faster transition time and rates of operation heretofore unattainable.

Other objects and features of the invention will become apparent to those skilled in the art as the disclosure is revealed in the following detailed description of the invention as illustrated in the accompanying sheet of drawing in which.

Figure 1:
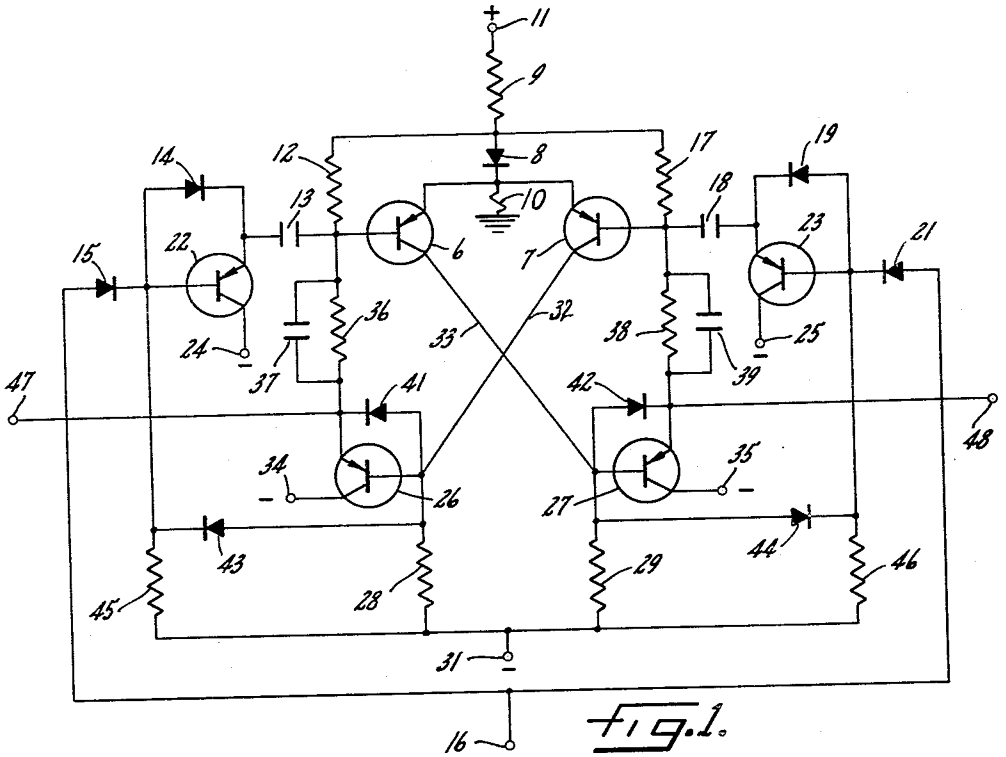
FIGURE 1 is a schematic diagram of a preferred embodiment of the invention.

Referring now to FIGURE 1 of the drawing, transistors 6 and 7 are the basic switching transistors, and the emitter electrodes thereof are coupled in common via diode 8 and resistance 9 to a source of positive potential 11 and via a very small resistance 10 to ground; the base electrode of transistor 6 is coupled via resistances 12 and 9 to source 11 and via input capacitance 13 and diodes 14 and 15 to input terminal 16 which receives input switching or trigger signals. In a like manner the base electrode of transistor 7 is coupled via resistances 17 and 9 to source 11 and via input capacitance 18 and diodes 19 and 21 to input terminal 16. Transistors 22 and 23 are emitter followers for rapidly charging input capacitances 13 and 18 respectively, at the proper time; transistor 22 has its emitter electrode coupled to capacitance 13, its collector electrode coupled to a source of negative direct current potential 24, and its base electrode coupled to the cathode of diode 15. Similarly, the emitter electrode of transistor 23 is coupled to input capacitance 18, the collector electrode is coupled to a source of negative direct current potential 25, and the base electrode is coupled to the cathode of diode 21. The base electrodes of emitter follower isolating transistors 26 and 27 are coupled via resistances 28 and 29 respectively to a source of negative direct current potential 31 and via conductors 32 and 33 respectively to the collector electrodes of switching transistors 6 and 7. The collector electrodes of transistors 26 and 27 are coupled to negative direct current potential sources 34 and 35 respectively, and the emitter electrodes thereof are coupled via the combinations of resistance 36-capacitance 37, and resistance 38-capacitance 39, respectively, to the base electrodes of transistors 6 and 7. Diode 41 has its cathode coupled to the emitter electrode of transistor 26 and its anode coupled to the base electrode thereof. Similarly, diode 42 has its cathode coupled to the emitter electrode of transistor 27 and its anode coupled to the base electrode thereof. Diode 43 has its cathode coupled to the base electrode of transistor 22 and its anode coupled via conductor 32 to the collector electrode of transistor 7; in a like manner, diode 44 has its cathode coupled to the base electrode of transistor 23 and its anode coupled via conductor 33 to the collector electrode of transistor 6. The base electrodes of transistors 22 and 23 are coupled to negative direct current potential source 31 via resistances 45 and 46, respectively. Output terminal 47 is coupled to the cathode of diode 41 and output terminal 48 is coupled to the cathode of diode 42.

It has been found that components and voltages of the following values and descriptions enable the satisfactory practice of one embodiment of the invention and its operation will be described relative thereto; however, these values and components are not to be construed as the only means of implementing the invention, and others may be found to perform equally as well or possibly even better.

| | |
|---|---|
| Transistors 6 and 7 | 2N769. |
| Transistors 22, 23, 26, and 27 | 2N711. |
| Diodes 14 and 19 | 1N3064. |
| Diodes 8, 15, 21, 41, 42, 43, and 44 | 1N277. |
| Potential Source 11 | +8 volts D.C. |
| Potential Sources 24, 25, 34, and 35 | —8 volts D.C. |
| Potential Source 31 | —28 volts D.C. |
| Capacitances 13 and 18 | 68 mmfd. |
| Capacitances 37 and 39 | 39 mmfd. |
| Resistances 9, 28, and 29 | 2200 ohms. |
| Resistance 10 | Nominally 5–10 ohms. |
| Resistances 12 and 17 | 3300 ohms. |
| Resistances 36 and 38 | 4700 ohms. |
| Resistances 45 and 46 | 27,000 ohms. |

*Operation*

Figure 2:
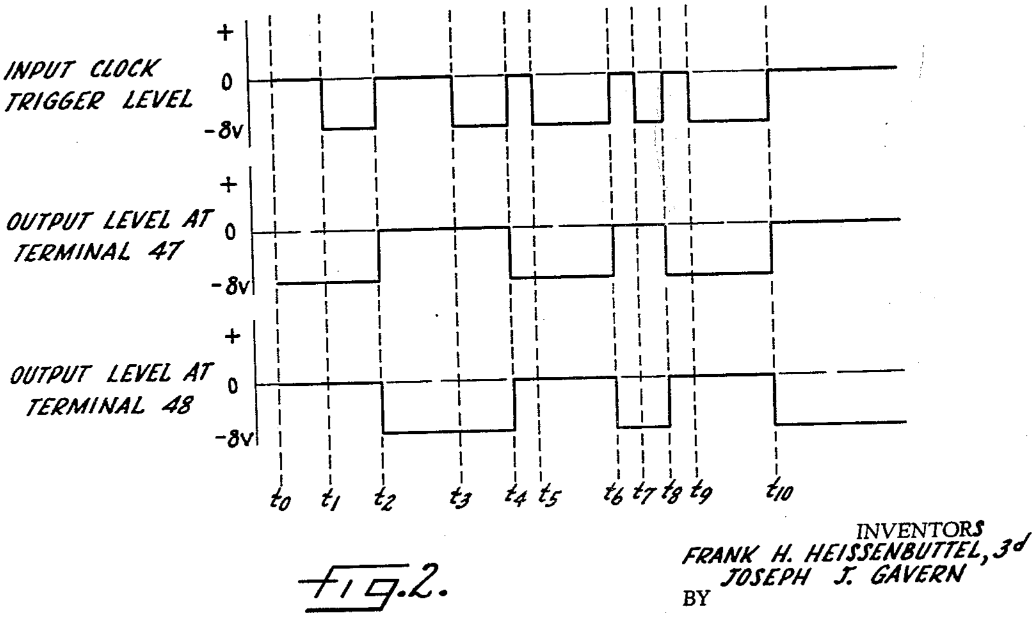
FIGURE 2 represents various input and iutput waveforms of the circuit and their relation to one another.

The operation of the invention occurs in the following manner. Assuming switching transistor 6 to be initially conducting and alternate switching transistor 7 to be nonconducting due to the common emitter coupling therebetween, the potential levels at output terminals 47 and 48 will be as shown in FIGURE 2 for the period $t_0$–$t_1$, that is, —8 volts at terminal 47 held thereby transistor 26 which is in saturation, and nominally zero volts (or ground potential) at terminal 48 due to its coupling via diode 42 and conductor 33 to the collector of conducting transistor 6. With reference to FIGURE 2, at time $t_1$, the input trigger level applied to terminal 16 suddenly drops from zero to —8 volts causing the potential applied to the base electrode of transistor 22 to drop from zero to —8 volts while the potential at the base electrode of transistor 23 is maintained at zero or ground potential which is being applied via forward biased diode 44 and conductor 33 due to the continuing conduction of transistor 6. As can be seen from FIGURE 2, no change in output level at either terminal 47 or 48 occurs as a result of the negative transition of the input level at time $t_1$. As the base electrode of transistor 22 drops from ground potential to —8 volts, diode 14 becomes reverse biased and the emitter-base junction of transistor 22 becomes forward biased. This enables input capacitor 13 to rapidly charge through the emitter-follower action of transistor 22, thus reducing the charging time constant of capacitor 13 in direct proportion to the $h_{fe}$ (current gain) of the transistor. The output levels remain constant during the period $t_1$–$t_2$ as shown in FIGURE 2.

At time $t_2$, the input trigger level applied to terminal 16 returns from −8 volts to zero or ground potential; this positive-going transition is conveyed, via diodes 15 and 14 and charged capacitor 13, to the base of conducting transistor 6 causing it to cease conduction. As the collector electrode of transistor 6 drops toward the −28 volt level of source 31, the output level at terminal 48 drops through the emitter-follower action of transistor 27, drawing current through resistance 38 and capacitance 39 until switching transistor 7 begins conduction. The collector of transistor 6, while dropping toward the −28 volt level of source 31, will fall only until the collector-base junction of transistor 27 becomes forward biased, thereby clamping the collector of nonconducting transistor 6, and output terminal 48, to the −8 volt source 35. As soon as the collector of transistor 7 begins to move positive from its previous −8 volt level, regeneration occurs and transistor 6 is held in a nonconducting condition. The ground potential applied to the base of transistor 23 during the period $t_0$–$t_2$ via diode 44 and conductor 33 from the collector of transistor 6 is withdrawn during this switching action when transistor 6 ceases to conduct; and although the base of transistor 23 remains at ground potential during the period $t_2$–$t_3$, this is due to the input trigger level applied at termial 16 rather than from any bias applied via diode 44. Also during the switching at time $t_2$, the initiation of conduction of transistor 7 causes a bias of approximately ground potential to be applied from the collector thereof via conductor 32, through diode 43 to the base of transistor 22 making it insensitive to a negative-going trigger signal, and through diode 41 to output terminal 47 causing it to rise (to zero or ground potential) for driving an external load.

During the period $t_2$–$t_3$ the input trigger level is shown as remaining at zero potential, and output terminals 47 and 48 remaining at zero and −8 volts respectively. At time $t_3$, the input level applied to terminal 16 drops to −8 volts but no change in output level occurs at either terminal 47 or 48 as a result thereof. Since the base of transistor 22 is being held at zero potential by the conduction of switching transistor 7 via conductor 32 and diode 43, the change in input level at terminal 16 has no effect on this transistor; however, this change in input level is reflected as a drop to −8 volts at the base of transistor 23, reverse biasing diode 19 and forward biasing the emitter-base junction of transistor 23 to enable rapid charging of input capacitance 18 therethrough.

At time $t_4$, the input level at terminal 16 rises from −8 volts to zero and this rise is conveyed, via diodes 21 and 19 and charged input capacitance 18 to the base of conducting transistor 7 causing it to cease conduction and to initiate, through regeneration as previously explained for the switching at time $t_2$, conduction in transistor 6 once again.

Thus it can be seen from the waveforms of FIGURE 2 that the invention alternates or "flips" once for every two transitions in input level, that is, a change from the zero to the −8 volt level is necessary to initiate charging of one of the respective input capacitances and a subsequent change from the −8 volt level to the zero level is essential to utilize the charged capacitance as a path for ceasing conduction in its associated switching transistor which by regeneration results in an initiation of conduction in the previously nonconducting one. Therefore, this requirement of two transitions in the level of the input trigger signal to obtain one transition in the level of the signal present at either of the output terminals is a useful property and makes the invention readily adaptable for many uses in digital logic circuitry. For example, it may be utilized in conjunction with a high speed digital counter to provide a division circuit since it will provide directly division by two, and with the proper feedback arrangement, could provide division by any integral power thereof.

The invention, in addition to being capable of operation at quite high frequencies (input clock repetition rates) due partially to the utilization of the gain of transistors 22 and 23 for reducing the input time constant of the circuit to a small fraction of its initial value by the rapid charging of input capacitances 13 and 18 respectively, also utilizes transistors 26 and 27 to isolate the switching transistor load resistances 28 and 29 from external loads during respective negative-going output transitions, thereby reducing the fall time of the output signal.

Thus it becomes apparent from the foregoing description and annexed drawing that the invention, a high frequency transistor bistable multivibrator, is a useful and practical device having many applications in the field of electronics. Obviously many modifications and variations of the present invention are possible in the light of the above teachings. It is therefore to be understood that, within the scope of the appended claims, the invention may be practiced otherwise than as specifically described.

We claim:

1. A high frequency, short input time constant, bistable multivibrator capable of high speed operation comprising:

first and second alternately conducting electron switching means, each having a control electrode and first and second conduction electrodes, said first conduction electrodes being respectively coupled in common with one another through a small resistance means to a source of ground potential and via a diode means and a resistance means in series to a source of direct current potential for providing a bias thereto;

first and second electron controlling input means, each said input means including a capacitance means having one terminal means coupled to the respective control electrodes of said first and second electron controlling input means, a transistor charging means for rapidly charging said capacitance means having its emitter electrode coupled to the other terminal of said capacitance means, its collector electrode coupled to a source of negative direct current potential, and its base electrode coupled via an input diode means to a common input terminal for receiving control signals to alternately switch the conduction levels of said first and second alternately conducting electron switching means, and a diode means having its anode coupled to the base electrode of said transistor charging means and having its cathode coupled to said other terminal of said capacitance means for enabling said control signals to bypass said transistor charging means and be conveyed directly to said control electrode of said first and second alternately conducting electron switching means via whichever of the respective said capacitance means is in a charged condition at that time; and first and second output control means, said first output control means including a first transistor means having its collector electrode coupled to a source of negative direct current potential, its base electrode coupled to said second conduction electrode of said second electron switching means and also via a resistance means to a negative direct current potential source, and its emitter electrode coupled via a parallel resistance-capacitance combination to the control electrode of said first electron switching means, a diode means having its anode coupled to said base electrode and its cathode coupled to said emitter electrode of said first transistor means, a first output terminal coupled to said emitter electrode of said first transistor means, and a diode biasing means coupled from said second conduction electrode of said second electron switching means to said base electrode of said transistor charging means in said first input means, and said second output control means including a second transistor means having its collector electrode coupled to a source of negative direct current potential, its base electrode coupled to said second conduction electrode of said first electron switching means and also via a resistance means to a negative direct current potential source, and its emitter electrode coupled via a parallel resistance-capacitance combination to the control electrode of said second electron switching means, a diode means having its anode coupled to said base electrode, and its cathode coupled to said emitter electrode, of said second transistor means, a second output terminal coupled to said emitter electrode of said second transistor means, and a diode biasing means coupled from said second conduction electrode of said first electron switching means to said base electrode of said transistor charging means in said second input means, said first and second output terminals providing a signal thereon indicative of the state of conduction of their associated respective switching means to an external load.

2. A high frequency, short input time constant, bistable transistor multivibrator circuit comprising:

first and second alternately conducting transistor switching means each having emitter, collector, and base electrodes, said emitter electrodes being coupled in common with each other through a small resistance means to a source of ground potential, and via a diode means and a resistance means in series to a source of positive direct current potential for providing a back bias to the emitter-base junctions of said switching means;

first and second electron controlling input means, each said input means including a capacitance means having one terminal means coupled to the respective base electrodes of said first and second transistor switching means, a transistor charging means for rapidly charging said capacitance means having its emitter electrode coupled to the other terminal of said capacitance means, its collector electrode coupled to a source of negative direct current potential, and its base electrode coupled via an input diode means to a common input terminal for receiving control signals to alternately switch the conduction levels of said first and second transistor switching means, and a diode means having its anode coupled to the base electrode of said transistor charging means and having its cathode coupled to said other terminal of said capacitance means for enabling said control signals to bypass said transistor charging means and be conveyed directly to said base electrode of said first and second transistor switching means via whichever of the respective said capacitance means is in a charged condition at that time; and first and second output control means, said first output control means including a first transistor means having its collector electrode coupled to a source of negative direct current potential, its base electrode coupled to said collector electrode of said second transistor switching means and also via a resistance means to a negative direct current potential source, and its emitter electrode coupled via a parallel resistance-capacitance combination to the base electrode of said first transistor switching means, a diode means having its anode coupled to said base electrode and its cathode coupled to said emitter electrode of said first transistor means, a first output terminal coupled to said emitter electrode of said first transistor means, and a diode biasing means coupled from said collector electrode of said second transistor switching means to said base electrode of said transistor charging means in said first input means, and said second output control means including a second transistor means having its collector electrode coupled to a source of negative direct current potential, its base electrode coupled to said collector electrode of said first transistor switching means and also via a resistance means to a negative direct current potential source, and its emitter electrode coupled via a parallel resistance-capacitance combination to the base electrode of said second transistor switching means, a diode means having its anode coupled to said base electrode, and its cathode coupled to said emitter electrode, of said second transistor means, a second output terminal coupled to said emitter electrode of said second transistor means, and a diode biasing means coupled from said collector electrode of said first transistor switching means to said base electrode of said transistor charging means in said second input means, said first and second ouptut terminals providing a signal thereon indicative of the state of conduction of their associated respective switching means to an external load.

References Cited in the file of this patent

UNITED STATES PATENTS 2,979,627 Halpern -------------- Apr. 11, 1961